(12) United States Patent
Kawasaki et al.

(10) Patent No.: US 12,713,517 B2
(45) Date of Patent: Aug. 18, 2026

(54) CIRCUIT BOARD DEVICE AND IMAGE FORMING APPARATUS

(71) Applicants: Ryosuke Kawasaki, Tokyo (JP); Tomoaki Suga, Kanagawa (JP)

(72) Inventors: Ryosuke Kawasaki, Tokyo (JP); Tomoaki Suga, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 189 days.

(21) Appl. No.: 18/659,246

(22) Filed: May 9, 2024

(65) Prior Publication Data

US 2024/0389218 A1 Nov. 21, 2024

(30) Foreign Application Priority Data

May 19, 2023 (JP) ................................ 2023-082697

(51) Int. Cl.
*H05K 1/02* (2006.01)
*G03G 15/00* (2006.01)

(52) U.S. Cl.
CPC ........... *H05K 1/0213* (2013.01); *G03G 15/80* (2013.01)

(58) Field of Classification Search
CPC ............................. H05K 1/0213; G03G 15/80
USPC .......................................................... 174/250
See application file for complete search history.

(56) References Cited

U.S. PATENT DOCUMENTS

2015/0207250 A1* 7/2015 Han ..................... H01R 12/718 439/82
2015/0216036 A1* 7/2015 Serizawa ............... H05K 1/117 174/250

FOREIGN PATENT DOCUMENTS

JP H10144834 A * 5/1998
JP 2007-158127 A 6/2007
JP 2024-001502 A 1/2024
JP 2024-049516 A 4/2024

* cited by examiner

*Primary Examiner* — Andargie M Aychillhum
(74) *Attorney, Agent, or Firm* — Harness, Dickey & Pierce, P.L.C.

(57) ABSTRACT

A circuit board device includes a conductive component, a metal frame, a conductive member, and a pressing member. The conductive component is disposed on an electronic board in a first direction and has a board face. The metal frame has a frame face intersecting the board face of the electronic board. The conductive member is disposed over the conductive component in the first direction and electrically connected to each of the conductive component and the metal frame. The pressing member presses the conductive member against the conductive component in the first direction.

9 Claims, 4 Drawing Sheets

FIRST MODIFICATION

SECOND MODIFICATION

CIRCUIT BOARD DEVICE AND IMAGE FORMING APPARATUS

CROSS-REFERENCE TO RELATED APPLICATIONS

This patent application is based on and claims priority pursuant to 35 U.S.C. § 119 (a) to Japanese Patent Application No. 2023-082697, filed on May 19, 2023, in the Japan Patent Office, the entire disclosure of which is hereby incorporated by reference herein.

BACKGROUND

Technical Field

Embodiments of the present disclosure relate to a circuit board device for grounding an electronic board, and an image forming apparatus including the circuit board device, such as a copier, a printer, a facsimile machine, or a multifunction peripheral having at least two of copying, printing, and facsimile functions.

Related Art

An image forming apparatus such as a copier or a printer, includes a circuit board device, i.e., a circuit board mounting device, for grounding an electronic board.

In addition, a technology reinforces grounding of an electronic board by interposing a conductive member between the ground of the electronic board and a metal frame of an image forming apparatus.

SUMMARY

In an embodiment of the present disclosure, a circuit board device includes a conductive component, a metal frame, a conductive member, and a pressing member. The conductive component is disposed on an electronic board in a first direction and has a board face. The metal frame has a frame face intersecting the board face of the electronic board. The conductive member is disposed over the conductive component in the first direction and electrically connected to each of the conductive component and the metal frame. The pressing member presses the conductive member against the conductive component in the first direction.

In another embodiment of the present disclosure, an image forming apparatus includes the circuit board device.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

Figure 1:
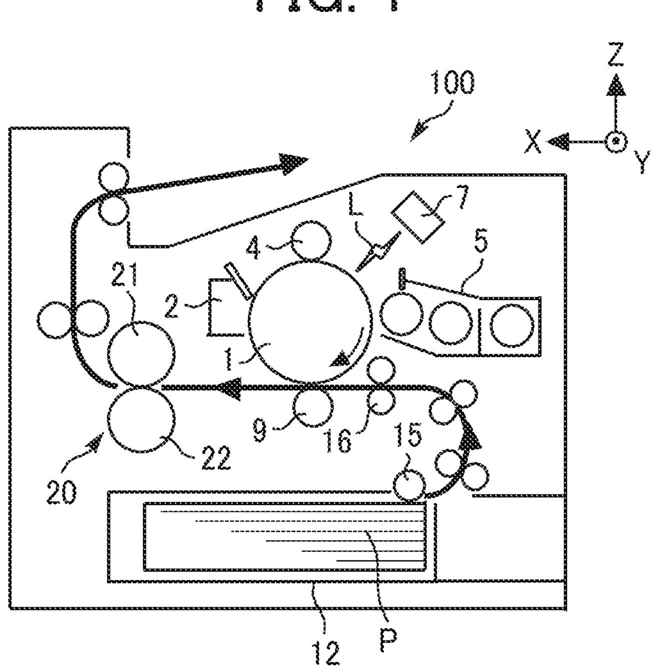
FIG. 1 is a diagram illustrating an overall configuration of an image forming apparatus according to an embodiment of the present disclosure.

The accompanying drawings are intended to depict embodiments of the present invention and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

Embodiments of the present disclosure are described below in detail with reference to the drawings. Like reference numerals are assigned to like or equivalent components and a description of those components may be simplified or omitted.

First, with reference to FIG. 1, a description is given below of an overall configuration and an operation of an image forming apparatus 100 according to an embodiment of the present disclosure.

In FIG. 1, the image forming apparatus 100 that is a printer in the present embodiment includes a photoconductor drum 1 on which a toner image is formed, and an exposure device, i.e., a writing device 7 and a transfer roller 9. The writing device 7 irradiates the photoconductor drum 1 with exposure light L based on image data input from an input device such as a personal computer. The transfer roller 9 transfers the toner image borne on the photoconductor drum 1 to a sheet P conveyed to a transfer nip, i.e., a transfer position.

The image forming apparatus 100 yet further includes a sheet feeder 12 in which sheets P such as a sheet of paper, are stored, a registration roller pair 16, i.e., a timing roller pair, to feed the sheet P toward the transfer nip at which the photoconductor drum 1 contacts the transfer roller 9, and a fixing device 20 to fix an unfixed image on the sheet P. The fixing device 20 includes a fixing roller 21 and a pressure roller 22.

The image forming apparatus 100 includes, for example, a charging roller 4, a developing device 5, and a cleaner 2 around the photoconductor drum 1.

With reference to FIG. 1, a description is given below of a typical image forming operation of the image forming apparatus 100.

The input device such as the personal computer sends image data to the exposure device 7 of the image forming apparatus 100, and the exposure device 7 irradiates the surface of the photoconductor drum 1 with the exposure light L, i.e., a laser beam, based on the image data.

The photoconductor drum 1 is driven by a driver to rotate in a direction indicated by the arrow in FIG. 1, that is, a clockwise direction. First, the surface of the photoconductor drum 1 is uniformly charged at a portion of the photoconductor drum 1 facing the charging roller 4 (charging process). Thus, a charged potential of about −900V is formed on the photoconductor drum 1. Subsequently, the charged surface of the photoconductor drum 1 reaches a position at which the exposure light Lis irradiated. An electric potential at the position at which the exposure light L is irradiated changes to a latent image potential, which is about 0 to −100 V, and an electrostatic latent image is formed on the surface of the photoconductor drum 1 (exposure process).

Subsequently, the surface of the photoconductor drum 1 on which the electrostatic latent image has been formed reaches a position opposite the developing device 5. The developing device 5 supplies toner onto the photoconductor drum 1. In so doing, the latent image that is formed on the photoconductor drum 1 is developed into a toner image (developing process).

After the developing process, the surface of the photoconductor drum 1 on which the toner image is borne reaches the transfer nip, i.e., the transfer position, formed between the photoconductor drum 1 and the transfer roller 9. At the transfer nip, a transfer bias having an opposite polarity to the toner is applied from a power source to the transfer roller 9. By so doing, the toner image that is formed on the photoconductor drum 1 is transferred onto the sheet P fed by the registration roller pair 16 (transfer process).

The surface of the photoconductor drum 1 after the transfer process reaches a position opposite the cleaner 2. At the position opposite the cleaner 2, a cleaning blade mechanically removes untransferred toner remaining on the surface of the photoconductor drum 1, and the removed toner is collected into the cleaner 2 (cleaning process).

A series of image forming processes on the photoconductor drum 1 is thus completed.

The sheet P is conveyed to the transfer nip, i.e., the transfer position, between the photoconductor drum 1 and the transfer roller 9 as follows.

First, a feed roller 15 feeds an uppermost sheet P stored in the sheet feeder 12 toward a conveyance path.

Subsequently, the sheet P reaches the position of the registration roller pair 16. The sheet P that has reached the position of the registration roller pair 16 is conveyed toward the transfer nip, i.e., a position at which the transfer roller 9 contacts the photoconductor drum 1, in synchronization with the toner image formed on the photoconductor drum 1 such that the image formed on the photoconductor drum 1 and the sheet P are aligned with each other.

After the transfer process, the sheet P passes through the transfer nip, i.e., the position of the transfer roller 9, and reaches the fixing device 20 through the conveyance path. In the fixing device 20, the sheet P is interposed between the fixing roller 21 and the pressure roller 22. The toner image is fixed on the sheet P by heat applied from the fixing roller 21 and pressure applied from both of the fixing roller 21 and the pressure roller 22. The sheet P on which the image has been fixed is sent out from a nip, i.e., the fixing nip, between the fixing roller 21 and the pressure roller 22. Then, the sheet P is ejected from the body of the image forming apparatus 100.

Thus, a series of the image forming processes is completed.

A description is now given below of the configuration and operation of a circuit board device 30 of the image forming apparatus 100 in detail, according to an embodiment of the present disclosure.

Figure 2A:
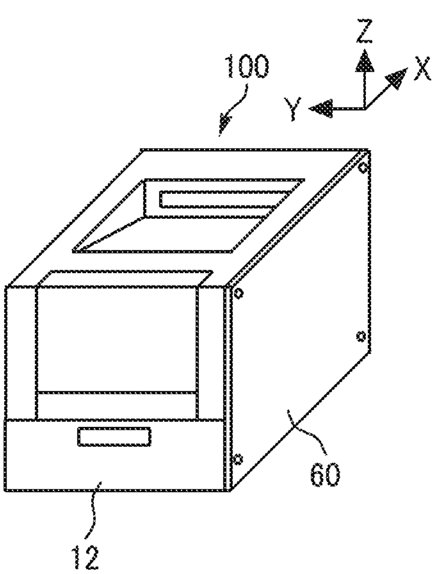
FIG. 2A is a perspective view of the image forming apparatus of FIG. 1.
Figure 2B:
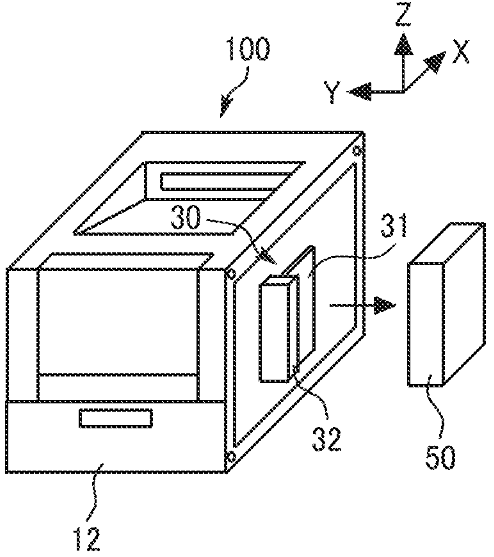
FIG. 2B is a perspective view of the image forming apparatus of FIG. 1, in which an exterior cover is removed and the box cover is further removed from the image forming apparatus.

The image forming apparatus 100 according to the present embodiment is covered with multiple exterior covers as illustrated in FIG. 2A. As illustrated in FIG. 2B, when an exterior cover 60 on the right side of the image forming apparatus 100 is removed, a controller box installed inside the body of the image forming apparatus 100 is exposed. When a box cover 50 is further removed, a circuit board device 30 is exposed.

The circuit board device 30 includes, for example, an electronic board 31 and a metal frame 32.

The electronic board 31 may be an engine circuit board that performs drive control of various drivers installed in the image forming apparatus 100, or a controller circuit board that performs, for example, an overall control of the image forming apparatus 100, communication, input control from an operation display unit in the image forming apparatus 100. The electronic board 31 is fixed to a housing, i.e., a side plate of the body, of the image forming apparatus 100 by, for example, snap-fitting.

The metal frame 32 functions as a part of a housing of the box cover 50 inside the box cover 50, i.e., a controller box. The metal frame 32 is fixed to the housing, i.e., the side plate of the body, of the image forming apparatus 100 by, for example, screwing.

Figure 3:
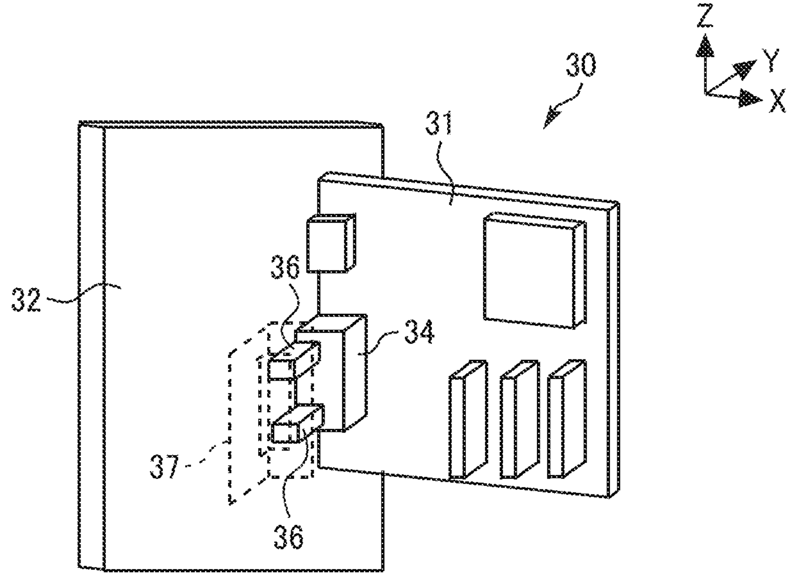
FIG. 3 is a perspective view of a part of the circuit board device according to an embodiment of the present disclosure.
Figure 4:
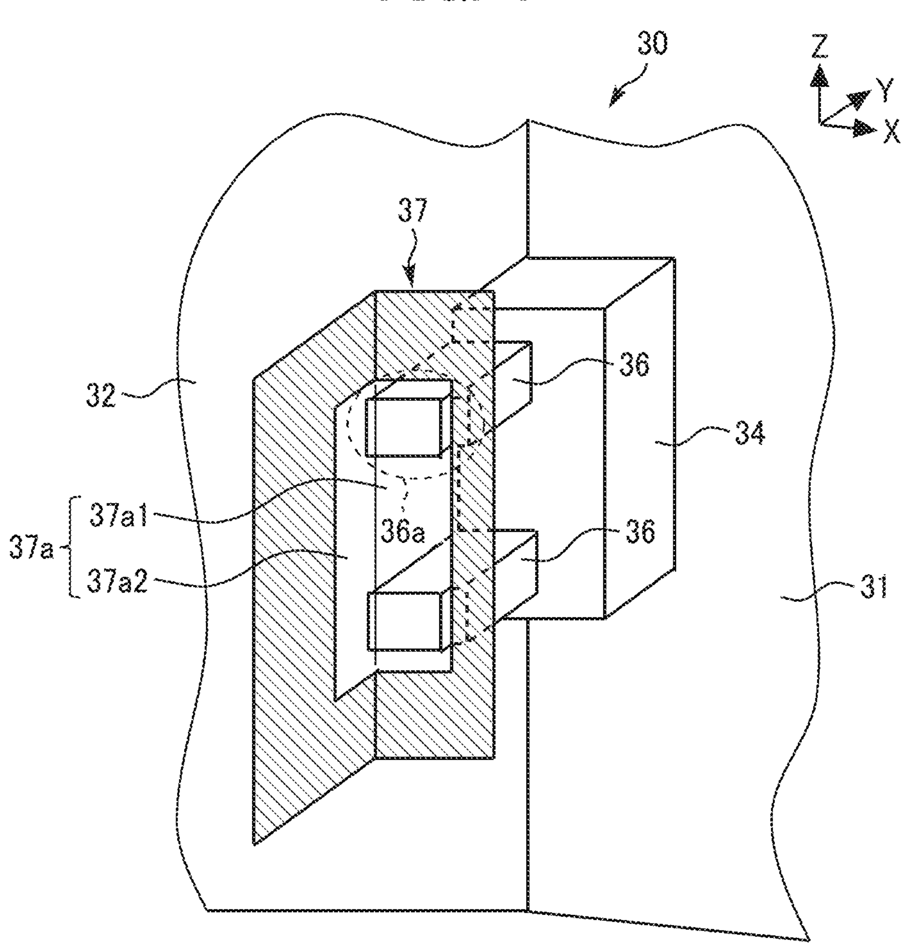
FIG. 4 is an enlarged perspective view of a relevant part of the circuit board device of FIG. 3.

As illustrated in, for example, FIGS. 3 and 4, in the circuit board device 30 according to the present embodiment, the electronic board 31 includes a conductive component 34 in addition to various electronic components. The conductive component 34 serves as a ground relay component for grounding the electronic board 31 and is formed of a conductive material such as metal. The conductive component 34 is fixed to the electronic board 31 by, for example, soldering.

The metal frame 32 has a face intersecting with (in the present embodiment, orthogonal to) the face of the circuit board of the electronic board 31. The metal frame 32 is electrically connected to the housing, which is grounded via, for example, a commercial power supply, of the image forming apparatus 100, and is grounded.

As illustrated in, for example, FIGS. 3 and 4, the circuit board device 30 of the present embodiment includes conductive members 36 that contact the conductive component 34 and the metal frame 32.

The conductive members 36 are ground reinforcing members for reinforcing the electrical connection between the metal frame 32 and the conductive component 34 and are elastic members, i.e., flexible members. Each of the conductive members 36 is attached to the conductive component 34 via a corresponding one of conductive double-sided adhesive tapes 41 (see FIGS. 6A and 6B). Examples of the conductive members 36 include, for example, conductive foamed polyurethane, conductive plastic having elasticity.

In the present embodiment, the two conductive members 36 are disposed. However, one or equal to or greater than three conductive members 36 may be disposed.

As illustrated in, for example, FIGS. 3, 4, 5A, 5B, and 6B, the circuit board device 30 according to the present embodiment includes a sheet-shaped member 37. The sheet-shaped member 37 serves as a pressing member that presses the conductive members 36 in a direction indicated by arrow Y in the present embodiment, in which the conductive members 36 contact the conductive component 34 or the metal frame 32.

Figure 5A:
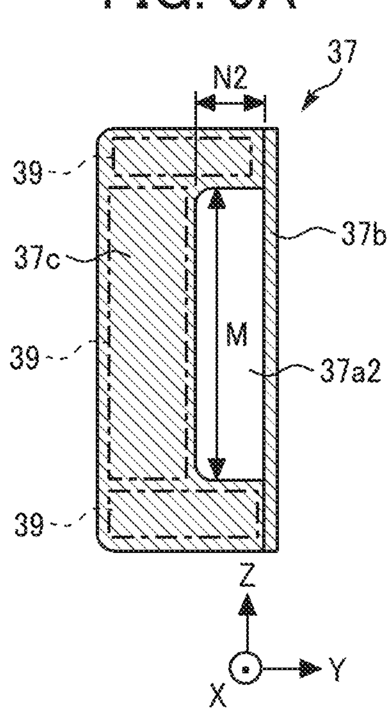
FIG. 5A is a plan view of a sheet-shaped member, viewed from a direction indicated by the arrow X in FIG. 4, according to an embodiment of the present disclosure.
Figure 6A:
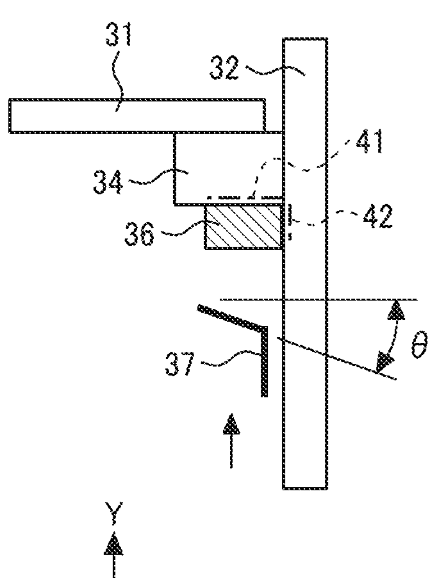
FIGS. 6A and 6B are diagrams each illustrating a relevant part of the circuit board device of FIG. 3, viewed from above.
Figure 6B:
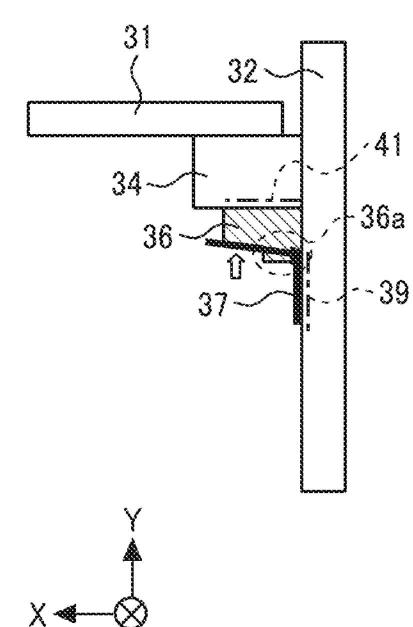
Figure 6B:
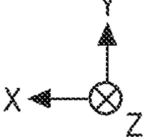

The sheet-shaped member 37 as the pressing member is a plate-shaped member made of, for example, a resin material and formed in a substantially L-shape and is attached to the metal frame 32 via a double-sided tape 39 (see FIGS. 5A and 6B). The sheet-shaped member 37 contacts and presses the two conductive members 36 such that the conductive members 36 are pressed by the sheet-shaped member 37 from a lateral direction, i.e., the direction indicated by arrow Y.

Figure 5B:
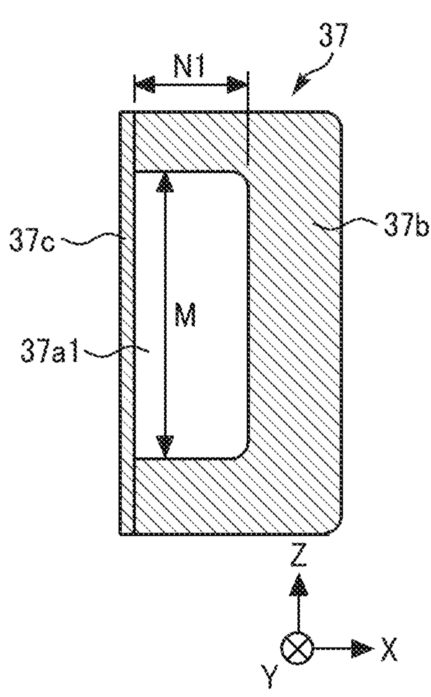
FIG. 5B is a plan view of the sheet-shaped member, viewed from a direction indicated by the arrow Y in FIG. 4, according to an embodiment of the present disclosure.

In the present embodiment, as illustrated in FIG. 6A, the sheet-shaped member 37 is set such that a bending angle θ of a pressing face 37*b* (see FIG. 5B) with respect to a fixing face 37*c* (see FIG. 5A) is larger than 0 degrees and equal to or smaller than 60 degrees (0°<θ<) 60° in a state in which an external force is not applied to the sheet-shaped member 37.

Accordingly, as illustrated in FIG. 6B, when the sheet-shaped member 37 is adhered to the metal frame 32 to press the conductive members 36, the pressing force, i.e., the resilient force, of the sheet-shaped member 37 can be increased in accordance with the size of the bending angle θ of the pressing face 37*b*.

The sheet-shaped member 37, i.e., the pressing member is disposed as described above. By so doing, the conductive members 36 are less likely to peel off from the conductive component 34 of the electronic board 31 or the metal frame 32.

More specifically, a frictional force is generated between the sheet-shaped member 37 and the conductive members 36 when the conductive members 36 are pressed by the sheet-shaped member 37, even if the adhesive force of the conductive double-sided adhesive tape 41 (see FIG. 6B) is reduced over time. Accordingly, the conductive members 36 are less likely to peel off from the conductive double-sided adhesive tape 41. For this reason, a disadvantage such as a short-circuiting of an electronic circuit when the conductive members 36 fall and contact surrounding electronic components is less likely to occur.

In the present embodiment, the pressing direction of the sheet-shaped member 37 against the conductive members 36 is set to the lateral direction, i.e., the direction indicated by arrow Y. However, the pressing direction is not limited to the direction indicated by arrow Y, and for example, the pressing direction can be set to the upward direction, i.e., the direction indicated by arrow Z.

In the present embodiment, the sheet-shaped member 37, i.e., the pressing member, has an opening 37*a* (see FIG. 4) including a first opening 37*a*1 formed in the pressing face 37*b* (see FIG. 5B) that presses the conductive members 36.

The first opening 37*a*1 of the opening 37*a* is continuous from a second opening 37*a*2 formed in a fixing face 37*c* (see FIG. 5A) of the sheet-shaped member 37, which is fixed to the metal frame 32 by the sheet-shaped member 37. In other words, the opening 37*a* of the sheet-shaped member 37 is formed inside the circuit board device 30 without being connected to the outside of the circuit board device 30. The opening 37*a* is formed such that the first opening 37*a*1 formed in the pressing face 37*b* and the second opening 37*a*2 formed in the fixing face 37*c* are continuous from each other at a portion at which the sheet-shaped member 37 is bent.

A portion of the conductive member 36 is elastically deformed by the pressure applied by the sheet-shaped member 37, and a non-pressed portion 36*a* enters the first opening 37*a*1 of the opening 37*a*. The non-pressed portion 36*a* is a portion that is not elastically deformed or is slightly elastically deformed (see, for example, FIGS. 4 and 6B).

Specifically, the single opening 37*a* including the first opening 37*a*1 is formed in the sheet-shaped member 37, and the two, i.e., multiple, conductive members 36 enter the single opening 37*a*.

With reference to FIG. 5B, a length M of the first opening 37*a*1 of the opening 37*a* in the width direction of the opening 37*a*, i.e., the direction indicated by arrow Z, which contacts the conductive members 36, is set to be longer than the length of the conductive member 36 in the width direction of the conductive member 36.

Lower ends, i.e., ends in the direction indicated by arrow Z, of the first opening 37*al* and the second opening 37*a*2 also function as stoppers in case the conductive members 36 may peel off.

The openings 37*a* of the sheet-shaped member 37, i.e., the first opening 37*a*1 and the second opening 37*a*2 also facilitate visual recognition of gaps between the sheet-shaped member 37 and the conductive members 36 and a condition in which the sheet-shaped member 37 and the metal frame 32 contact each other when the sheet-shaped member 37 is aligned in the direction indicated by arrow Y, i.e., the pressing direction.

A length N1 of the first opening 37*a*1 in the direction indicated by arrow X (see FIG. 5B) and the bending angle θ of the pressing face 37*b* described above with reference to FIG. 6A are determined to optimize the pressing force of the sheet-shaped member 37 against the conductive members 36. In particular, when the pressing force of the sheet-shaped member 37 is too large, the sheet-shaped member 37 is likely to peel off from the metal frame 32. For this reason, preferably, the above-described specifications such as the length N1 and the bending angle θ are optimized.

In the present embodiment, the specifications of the components are set such that a following relation of $0<f<F$ is satisfied, when the adhesive force of the sheet-shaped member 37 to the metal frame 32 by the double-sided tape 39 is F (N), and the compressive force, i.e., the reaction force of the pressing force, of the conductive member 36 elastically deformed by the sheet-shaped member 37 is f (N).

In the present embodiment, the compressive force per unit area of the conductive member 36 is substantially uniform regardless of the amount of elastic deformation, i.e., the amount in which the conductive member 36 is compressed. Accordingly, a compressive force proportional to a contact area in which the conductive member 36 and the sheet-shaped member 37 contact each other, is generated. Accordingly, the above-described length C is set from the contact area that satisfies the relation of $0<f<F$. Specifically, in the present embodiment, the length C is set such that the relation of $F/f>5$ is satisfied.

In the present embodiment, with reference to FIGS. 4, 5A, and 6B, the opening 37*a* of the sheet-shaped member 37 is formed such that the non-pressed portions 36*a* of the conductive member 36 contact the second opening 37*a*2.

Specifically, the sheet-shaped member 37 is adhered to the metal frame 32 to be positioned at a position at which the non-pressed portions 36*a* contacts an end of the second opening 37*a*2 in the direction indicated by arrow Y, i.e., a direction opposite the pressing direction. Accordingly, a length N2 of the second opening 37*a*2 in the direction indicated by arrow Y illustrated in FIG. 5A is determined to optimize the amount of elastic deformation of the conductive members 36, i.e., the amount in which the conductive members 36 are compressed, as described above. In the present embodiment, the length N2 is set to be larger than 0 and equal to or smaller than half the length of the conductive member 36 in the direction indicated by arrow Y.

The length M of the second opening 37*a*2 in the width direction, which contacts the non-pressed portions 36*a* of the conductive members 36, is set to be longer than the length of the conductive member 36 in the width direction. The length M of the second opening 39*a*2 is equal to the length M of the first opening 37*al*.

First Modification

Figure 7:
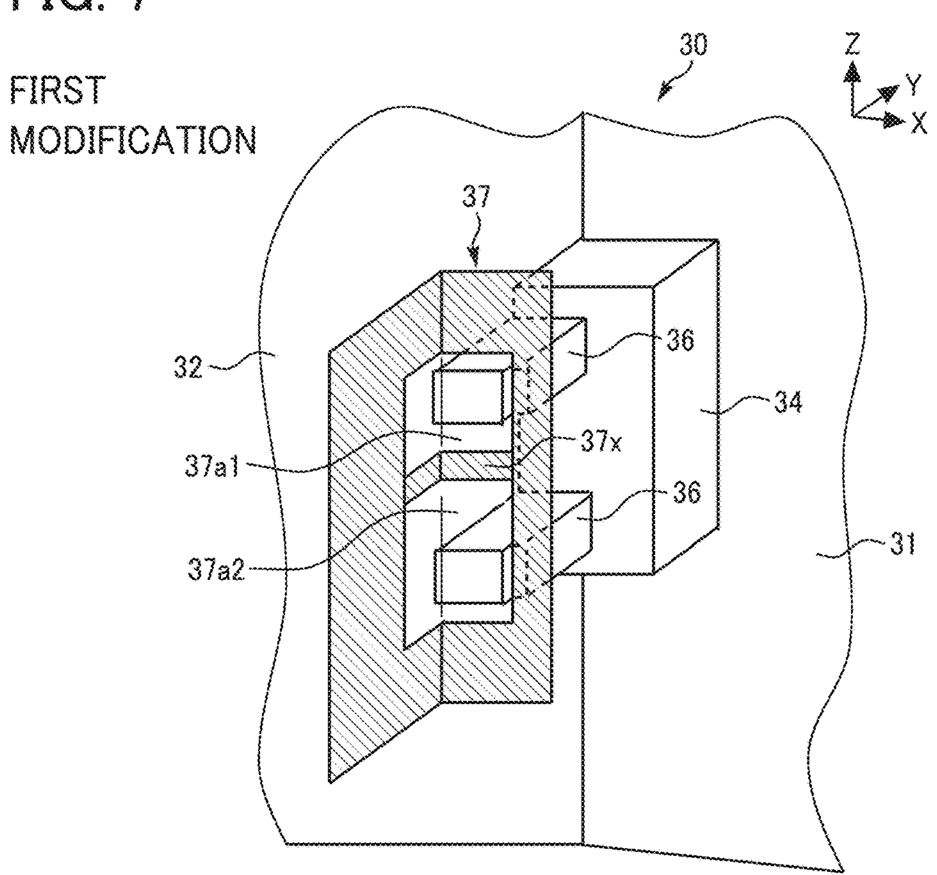
FIG. 7 is an enlarged perspective view of a relevant part of a circuit board device according to a first modification of the present disclosure.

As illustrated in FIG. 7, in the circuit board device 30 according to a first modification, each of the multiple conductive members 36 enters corresponding one of multiple openings 37*a*.

Specifically, in the circuit board device 30 according to the first modification, two conductive members 36 are disposed on the conductive component 34 with a gap between each of the conductive members 36 in the direction indicated by arrow Z.

In addition, the two openings 37*a*, i.e., the first opening 37*a*1 and the second opening 37*a*2, that are partitioned by a partition 37*x* are formed in the sheet-shaped member 37. The sheet-shaped member 37 is adhered to the metal frame 32 such that one of the conductive members 36, i.e., the upper conductive member 36 enters one of the openings 37*a*, i.e., the first opening 37*a*1 and the other conductive member 36, i.e., the lower conductive member 36 enters the other opening 37*a*, i.e., the second opening 37*a*2. Even in such a configuration, the conductive members 36 are less likely to peel off.

Second Modification

Figure 8:
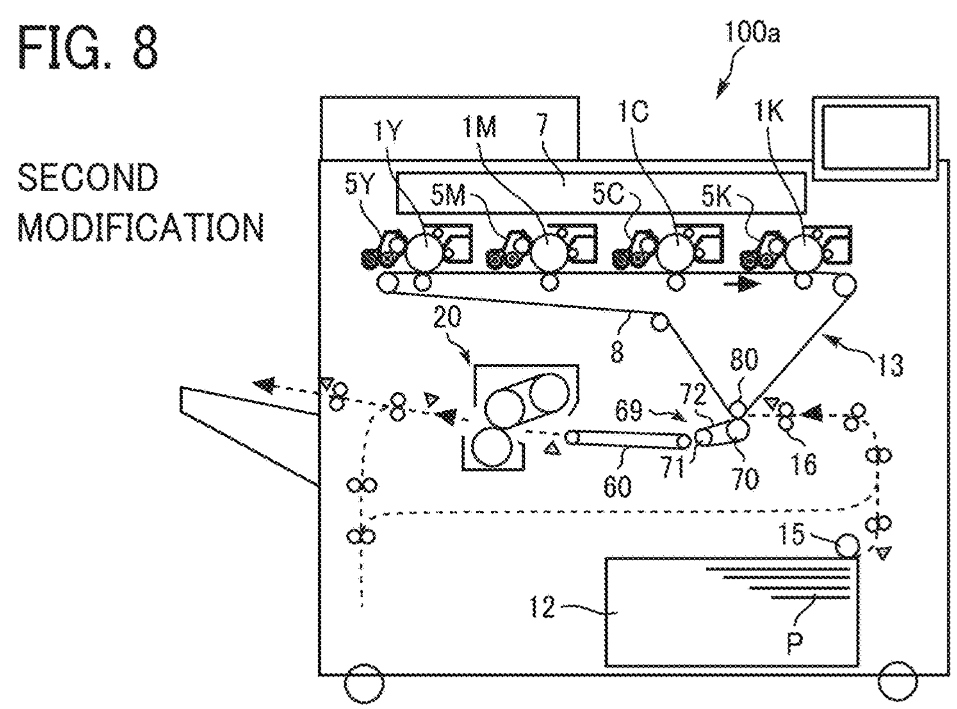
FIG. 8 is a diagram illustrating an overall configuration of an image forming apparatus according to a second modification of the present disclosure.

As illustrated in FIG. 8, an image forming apparatus 100*a* according to a second modification is a commercial large-sized color image forming apparatus, unlike the personal small-sized monochrome image forming apparatus 100 illustrated in FIG. 1.

In the image forming apparatus 100*a* illustrated in FIG. 8, four photoconductor drums 1Y for yellow color, 1M for magenta color, 1C for cyan color, and 1K for black color are arranged side by side to face an intermediate transfer belt 8 of an intermediate transfer belt device 13. The four photoconductor drums 1Y, 1M, 1C, and 1K include image forming devices such as developing devices 5Y, 5M, 5C, and 5K, respectively, similar to the developing device 5 illustrated in FIG. 1, and images of the colors of yellow, magenta, cyan, and black are formed on the photoconductor drums 1Y, 1M, 1C, and 1K, respectively. The four color images are primarily transferred onto the intermediate transfer belt 8 on top of one another to form a color image, and the color image is secondarily transferred onto a sheet P at a position facing a secondary transfer device 69, at which a secondary transfer counter roller 80 is disposed on the inner peripheral surface of the intermediate transfer belt 8. The secondary transfer device 69 includes, for example, a secondary transfer roller 70, a tension roller 71, and a secondary transfer belt 72. The sheet P on which the color image has been formed is ejected from the image forming apparatus 100*a* after the fixing process by the fixing device 20 is performed.

The circuit board device 30 of the second modification has a configuration similar to the configuration of the circuit board device 30 of the embodiments described with reference to, for example, FIGS. 3, 4, 5A, 5B, 6A, and 6B, or the configuration described with reference to FIG. 7.

Accordingly, also in the image forming apparatus 100*a* according to the second modification, the conductive members 36 are less likely to peel off.

As described above, the circuit board device 30 according to embodiments of the present disclosure includes the conductive component 34 disposed on the electronic board 31, the metal frame 32 having the face intersecting the face of the circuit board of the electronic board 31, the conductive members 36 that contact the conductive component 34 and the metal frame 32, and the sheet-shaped member 37 as the pressing member that presses the conductive members 36 in a direction in which the conductive members 36 contact the conductive component 34 or the metal frame 32.

Such a configuration as described above allows the conductive members 36 to be less likely to peel off from the conductive component 34.

The above-described embodiments of the present disclosure are applied to the circuit board device 30 installed in the electrophotographic image forming apparatus 100. However, the embodiments of the present disclosure are not limited to the circuit board device 30. For example, the embodiments of the present disclosure can also be applied to a circuit board device installed in an image forming apparatus of another type such as an inkjet-type image forming apparatus or an offset printing machine or a circuit board device installed in an apparatus other than the image forming apparatus.

Even in such cases, an effect similar to, even if not the same as, that of the embodiments of the present disclosure can be obtained.

The present disclosure is not limited to the above-described embodiments and it is apparent that the above-described embodiments can be appropriately modified within the scope of the technical idea of the present disclosure in addition to what is suggested in the above-described embodiments. Further, the number, position, shape, and so forth of components are not limited to those of the present embodiment and variations, and may be the number, position, shape, and so forth that are suitable for implementing the present disclosure.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A circuit board device comprising:

a conductive component on an electronic board in a first direction, the conductive component having a board face;

a metal frame having a frame face intersecting the board face of the electronic board;

a conductive member over the conductive component in the first direction, the conductive member electrically connected to each of the conductive component and the metal frame, the conductive member having an elasticity, and the conductive member being adhered to the conductive component via a conductive double-sided adhesive tape; and a pressing member to press the conductive member against the conductive component in the first direction, the pressing member having an L shape having a first face over the conductive member, and a second face over the metal frame.

2. The circuit board device according claim 1, wherein the pressing member has:

the first face to press the conductive member against the conductive component; and an opening in the first face, and the conductive member includes:

a pressed portion contacting the first face of the pressing member and elastically deformable by a pressure applied by the pressing member; and a non-pressed portion entering through the opening.

3. The circuit board device according to claim 2, wherein a length of the opening is longer than a length of the conductive member in a second direction intersecting the first direction.

4. The circuit board device according to claim 2, wherein the pressing member has the opening in the second face continuous from the opening in the first face, and the non-pressed portion of the conductive member contacts the second face in the first direction.

5. The circuit board device according to claim 4, wherein a length of the opening in the second face is longer than a length of the conductive member in a second direction intersecting the first direction.

6. The circuit board device according to claim 4, wherein the second face of the pressing member is adhered to the metal frame via a conductive double-sided adhesive tape.

7. The circuit board device according to claim 2, further comprising:

multiple conductive members including the conductive member, each of the multiple conductive members having the non-pressed portion entering through the opening.

8. The circuit board device according to claim 7, further comprising multiple openings including the opening, wherein the multiple conductive members respectively include multiple non-pressed portions including the non-pressed portion, and the multiple non-pressed portions respectively enter through the multiple openings.

9. An image forming apparatus comprising the circuit board device according to claim 1.

* * * * *